United States Patent
Zhang et al.

(10) Patent No.: US 10,713,104 B2
(45) Date of Patent: Jul. 14, 2020

(54) STORAGE SYSTEM WITH READ THRESHOLD MECHANISM AND METHOD OF OPERATION THEREOF

(71) Applicant: CNEX LABS, Inc., San Jose, CA (US)

(72) Inventors: Xiaojie Zhang, Saratoga, CA (US); Yi Liu, San Diego, CA (US)

(73) Assignee: CNEX LABS, Inc., San Jose, CA (US)

( * ) Notice: Subject to any disclaimer, the term of this patent is extended or adjusted under 35 U.S.C. 154(b) by 0 days.

(21) Appl. No.: 15/723,951

(22) Filed: Oct. 3, 2017

(65) Prior Publication Data
US 2019/0102084 A1 Apr. 4, 2019

(51) Int. Cl.
*G06F 12/00* (2006.01)
*G06F 11/00* (2006.01)
*G06F 3/06* (2006.01)
*G11C 16/26* (2006.01)
*G11C 11/56* (2006.01)

(52) U.S. Cl.
CPC ............ *G06F 11/004* (2013.01); *G06F 3/061* (2013.01); *G06F 3/0619* (2013.01); *G06F 3/0655* (2013.01); *G06F 3/0688* (2013.01); *G06F 11/008* (2013.01); *G11C 11/5642* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 9,710,325 B2 | 7/2017 | Chen et al. | |
| 9,710,327 B2 | 7/2017 | Ha et al. | |
| 9,720,754 B2 | 8/2017 | Karakulak et al. | |
| 2017/0264312 A1 | 9/2017 | Varanasi et al. | |
| 2017/0271031 A1* | 9/2017 | Sharon | G11C 29/42 |

\* cited by examiner

*Primary Examiner* — Daniel D Tsui
(74) *Attorney, Agent, or Firm* — Perspectives Law Group, Corp.

(57) ABSTRACT

A storage system includes: a control processor, configured to: read user data, generate a bit flip array from the user data including limiting a threshold offset range, and select an optimal read threshold set from the bit flip array; and a non-volatile memory array, coupled to the control processor, configured to store the user data; and wherein the control processor is further configured read a sector N with the optimal read threshold set for enhancing performance of the non-volatile memory array.

30 Claims, 5 Drawing Sheets

STORAGE SYSTEM WITH READ THRESHOLD MECHANISM AND METHOD OF OPERATION THEREOF

TECHNICAL FIELD

An embodiment of the present invention relates generally to a storage system, and more particularly to a system for adjustment of read threshold voltage.

BACKGROUND

Nonvolatile memory, such as NAND flash, has driven massive increases in capacity and verification processes to support intelligent devices. In order to reduce the cost per gigabyte nonvolatile memories, these devices have become denser by packing more data in the same silicon area, by scaling the size of the flash cells, adding three dimensional arrays of storage cells, and storing more bits in each of them, but the changes in cell-size and storage cell configuration has come at the cost of read back reliability. In order to manage the multiple bits per cell, the adjustment of the read threshold voltage has become critical and time consuming. As the voltage level of adjacent calls becomes more closer a means for quickly finding the threshold voltage to correctly identify the data stored in each cell becomes more problematic.

Thus, a need still remains for a storage system with read threshold adjustment mechanism to provide improved data reliability and minimize read access times. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an apparatus, including a control processor, configured to: read user data, generate a bit flip array from the user data includes limiting a threshold offset range, and select an optimal read threshold set from the bit flip array; and a non-volatile memory array, coupled to the control processor, configured to store the user data; and wherein the control processor is further configured read a sector N with the optimal read threshold set for enhancing performance of the non-volatile memory array.

An embodiment of the present invention provides a method including: reading user data from a non-volatile memory array; generating a bit flip array from the user data including limiting a threshold offset range; selecting an optimal read threshold set from the bit flip array; and reading a sector N with the optimal read threshold set for enhancing performance of the non-volatile memory array.

An embodiment of the present invention provides a non-transitory computer readable medium including: reading user data from a non-volatile memory array; generating a bit flip array from the user data including limiting a threshold offset range; selecting an optimal read threshold set from the bit flip array; and reading a sector N with the optimal read threshold set for enhancing performance of the non-volatile memory array.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
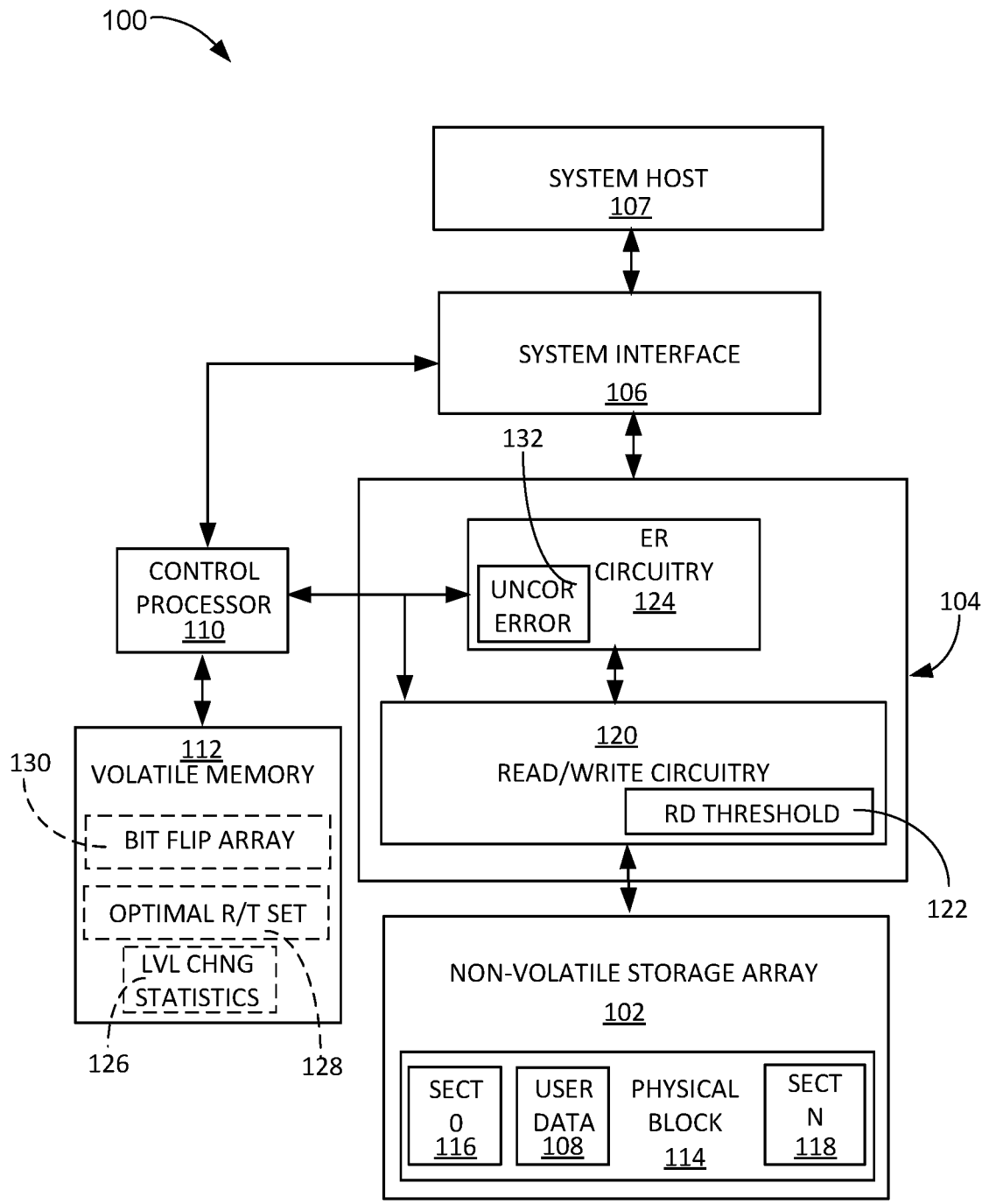
FIG. 1 is a storage system with read threshold mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation.

The term "module" referred to herein can include hardware or hardware supported by software in an embodiment of the present invention in accordance with the context in which the term is used. For example, the software can be machine code, firmware, embedded code, and application software. Also for example, the hardware can be circuitry, processor, computer, integrated circuit, integrated circuit cores, application specific integrated circuit (ASIC), passive devices, or a combination thereof.

As an example, one method to reduce the time spent in error recovery is to apply a read threshold mechanism to predict the optimum read threshold of a storage page and adjust it for the usable storage before the errors become unrecoverable.

Referring now to FIG. 1, therein is shown a functional block diagram of a storage system 100 with read threshold mechanism in an embodiment of the present invention. The functional block diagram of the storage system 100 depicts a non-volatile memory array 102 coupled to a read/write channel 104. A system interface 106 transfers user data 108 to and from the non-volatile memory array 102. The system interface 106 can execute the movement of the user data 108 into and out of the storage system 100. As an example, the system interface 106 can transfer user data 108 through the read/write channel 104 for storage to and retrieval from the non-volatile memory array 102.

A control processor 110 can provide at least a portion of the computation resource for the storage system 100. The control processor 110 can coordinate the operation of the storage system 100. As an example, the control processor 110 can be coupled to the system interface 106, the read channel 104, and a volatile memory 112.

The volatile memory 112 provides at least a portion of the storage of information for the storage system 100. As examples, the volatile memory 112 can be a volatile memory array, such as a matrix of interconnected volatile memory integrated circuits including dynamic random access memory (DRAM), static random access memory (SRAM), register files, non-volatile memory, or a combination thereof, coupled to the control processor 110.

The system interface 106 can be supported by the control processor 110. The control processor 110 can be implemented with hardware circuitry in a number of different manners. For example, the control processor 110 can be a processor, an application specific integrated circuit (ASIC), an embedded processor, a microprocessor, a hardware control logic, a hardware finite state machine (FSM), a digital signal processor (DSP), or a combination thereof. The system interface 106 can be implemented as a hardware control logic, a hardware finite state machine (FSM), or a programmable bus controller, that can provide data transport between the non-volatile memory array 102 and a system host 107.

The system host 107 can be a computer, a processor, a processor core, a device controller, or a combination thereof configured to generate, store, and retrieve the user data 108. The host system 107 can be directly coupled to the system interface 106, or it can be attached through a local bus, a local area network (LAN), or wide area network (WAN).

The non-volatile memory array 102 can be a matrix of interconnected non-volatile memory integrated circuits, such as NAND flash array of single level cells (SLC) or multi-level cells (MLC) or another non-volatile memory technology. The non-volatile memory array 102 can be a remote resource, such as a NAND flash based network attached storage (NAS), storage area network (SAN), or a combination thereof. The cells in the non-volatile memory array 102 are organized into a plurality of physical blocks 114. Each of the physical blocks 114 can contain data sectors from sector 0 116 through sector N 118. Where the sector can be a read/write unit sector, a physical page, a word line, or a physical block.

The read/write channel 104 can be a hardware structure that can be supported by software, to encode and decode the user data 108 for storage in the non-volatile memory array 102. A read/write circuitry 120 can manage the writing to the sector 0 116 through sector N 118. During the reading of the user data 108, the read/write circuitry 120 can manipulate a read threshold 122 in order to adjust for errors detected by an error recovery (ER) circuitry 124. The control processor 110 can collect a count of the read data level changes as the read threshold 122 is changed. The control processor 110 can maintain the count of level change statistics 126 indicating that a bit flip in the user data 108 caused by a level change has occurred on any of the read thresholds 122, which can be stored in the volatile memory 112.

The control processor 110 can adjust the read threshold 122, of the sector 0 116 through sector N 118, based on the read threshold mechanism of the level change statistics 126, such as the bit flip count or information indicating a change in the data level between adjacent values of the read threshold 122, in order to maintain the operational performance of the currently addressed sector in the physical block 114.

The control processor 110 can manage the operation of the read/write channel 104 including performing calculations, optimizing the read threshold 122, and execution of interface commands delivered from the host system 107. The control processor 110 can provide the level change statistics 126 when reading the user data 108. The ER circuitry 124 can be a hardware structure used to encode intended or targeted data for providing error protection, error detection, error correction, redundancy, or a combination thereof. During the analysis of the read threshold 122, the control processor 110 can read the user data 108, without the ER circuitry 124 performing error correction on the data, in order to capture each instance of a level change in the user data 108.

The read threshold 122 is defined as selectable voltage reference used when reading the stored value in the sector 0 116 through sector N 118. The read threshold 122 can provide the voltage reference in incremental steps. By way of an example, the read threshold can have 128 linear steps that set the reference voltage for each of the design point voltage levels for the ideal read-back cell. The TLC NAND will have 7 major bit thresholds, {A, B, C, D, E, F, G}. The 128 steps available can be centered on each of the 7 major thresholds. This can be compared to QLC NAND, which has 15 major thresholds, and 128 steps applied to each.

The storage system 100 can generate an optimal read threshold set 128 by performing multiple reads of the user data 108 with stepped values of the read threshold 122. Between reads the read threshold 122 can be incremented and the resulting data compared. By detecting and logging the number of bits that change value on each incremental step, a bit flip array 130 can be constructed. The bit flip array can be a matrix of the number of level changes counted for each selected offset step count for each of the read threshold 122 {A, B, C, D, E, F, G}. The control processor 110 can search the bit flip array for the offset values that represents the minimum number of changed bits for each of the read threshold 122 {A, B, C, D, E, F, G}. These offset values represent the optimal read threshold set 128, which can provide the best possibility of correctly reading the user data 108 without detecting an uncorrectable error 132. It is understood that the uncorrectable error 132 is a data error that contains too many bit errors for the ER circuitry 124 to correct the user data 108 without additional read processing.

As the sector 0 116 through sector N 118 are repeatedly accessed, the voltage level of the stored data can shift making the valid settings for the read threshold 122 change over time. It is understood that the read threshold 122 can be adjusted dynamically based on the level change statistics 126 detected by the ER circuitry 124. The detection of the uncorrectable error 132 can cause the regeneration of the bit flip array 130 and selection of a new set of the optimal read threshold set 128 in order to better read the non-volatile memory array 102.

For illustrative purposes, the storage system 100 will be described as utilizing the read threshold mechanism in storing and accessing information with NAND flash memory. However, it is understood that the storage system 100 can utilize the read threshold mechanism with other types of memory, such as resistive non-volatile memory, other types of flash or non-volatile memory, or a combination thereof.

It is understood that the embodiment discussed above is used to describe the invention and other embodiments are possible. Another possible embodiment can integrate the control processor 110, the read/write channel 104, the system interface 106, the non-volatile memory array 102, or a combination thereof into a single circuit.

It has been discovered that the control processor 110 can proactively map an optimal read threshold set 128 for the sector 0 116 through sector N 118 in the physical block 114. This can allow the ER circuitry 124 to calculate the level change statistics 126 for further monitoring the read reliability of the sector 0 116 through sector N 118.

Figure 2:
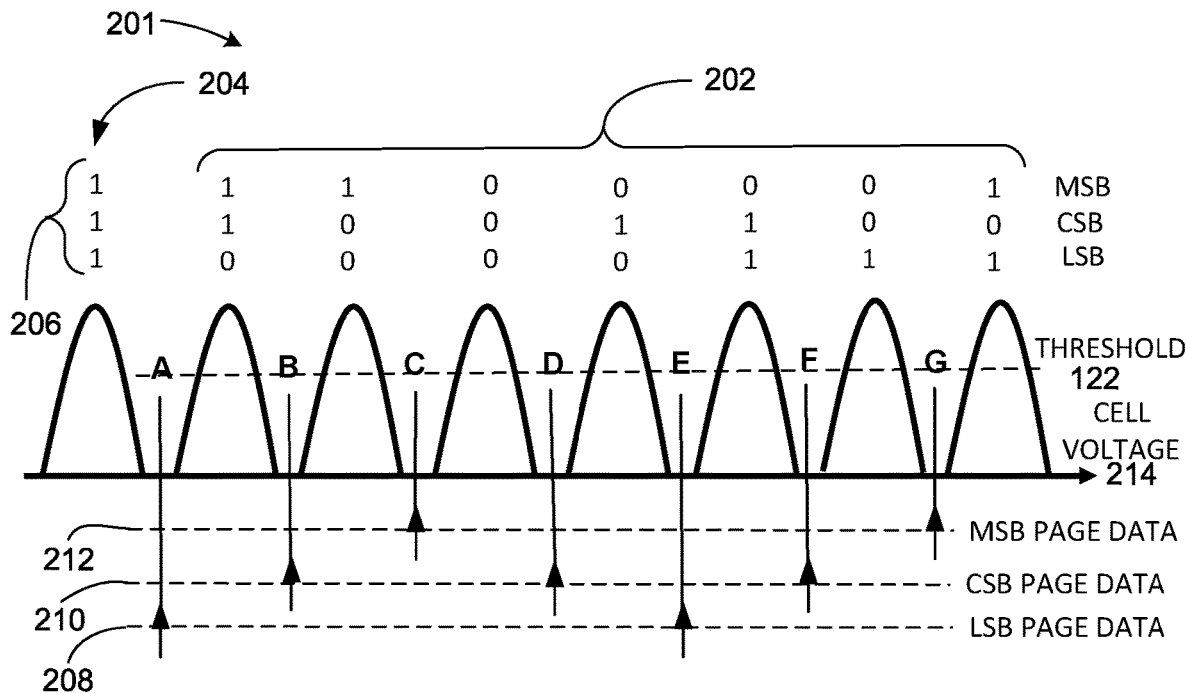
FIG. 2 depicts a graphical view of an exemplary access of a tri-level cell NAND flash page.

Referring now to FIG. 2, therein is shown a graphical view of an exemplary access of a tri-level cell NAND flash sector. The graphical view of the exemplary access 201 depicts accessing 7 of the read threshold 122 applied to a TLC cell for detecting the TLC data.

In a m-bit flash, each cell stores one of $2^m$ distinct predefined voltage levels. When each cell stores multiple bits, i.e. m≥2, the mapping of information bits to voltage levels is done using Gray coding to ensure that only one bit changes between adjacent levels. This is done because errors are most likely to occur between adjacent levels. Gray coding minimizes the average BER. Furthermore, each of the m bits is assigned to a different sector.

It is understood that only a portion of the access of the sector 0 116 of FIG. 1 through sector N 118 of FIG. 1 is shown. This is for ease of understanding and brevity. Each access can involve one or more of the sector 0 116 through sector N 118. Once output data 206 has been assembled as the sector 0 116 through sector N 118, the ER circuitry 124 can analyze least significant bit (LSB) sector data 208, center significant bit (CSB) sector data 210, and most significant bit (MSB) sector data 212.

A large number of program and erase (P/E) cycles can cause the cells voltage to deviate from expected ranges after programming. Read disturbs, which refers to a significant amount of read operation on the sector 0 116 through sector N 118 of the physical block 114 of FIG. 1, will also cause the cell voltages 214 in the physical block 114 to shift to a higher range. Therefore, it is extremely critical to calculate the optimal read threshold set 128 of FIG. 1, which provide the smallest number of read errors.

Figure 3:
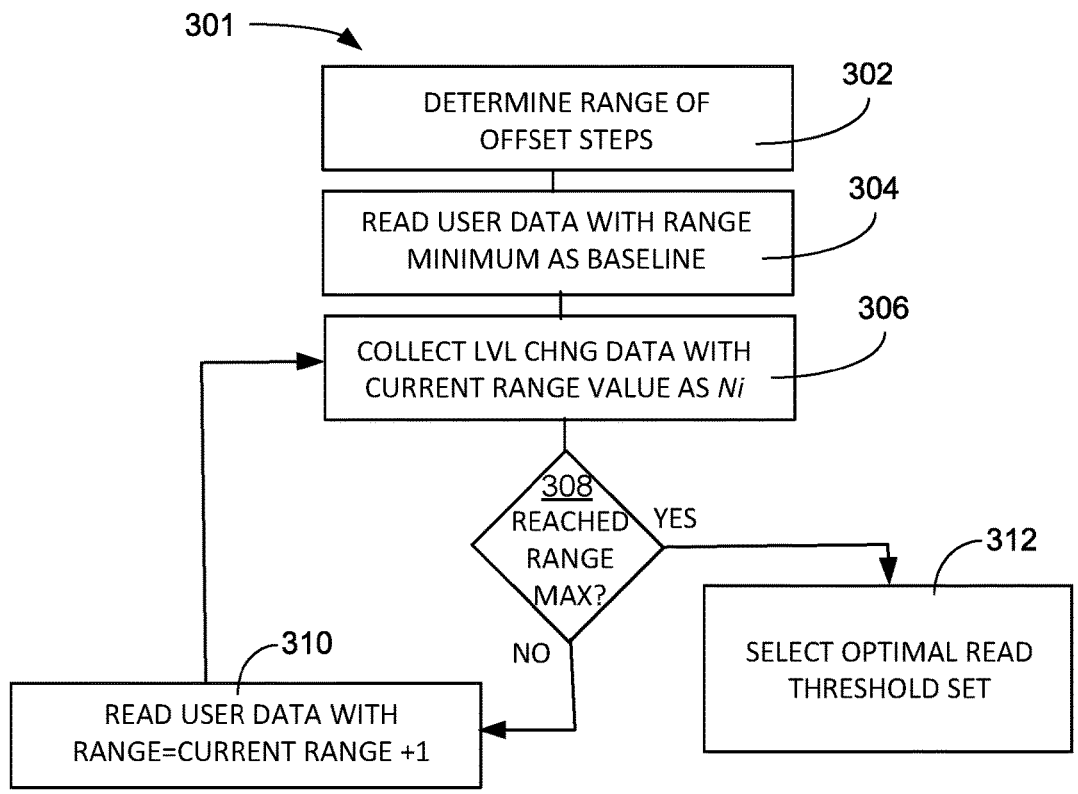
FIG. 3 is an operational flow diagram of the read threshold mechanism for selecting an optimal read threshold set in an embodiment of the present invention.

Referring now to FIG. 3, therein is shown an operational flow diagram of a read threshold mechanism 301 for selecting the optimal read threshold set in an embodiment of the present invention. The operational flow diagram of a read threshold mechanism 301 can depict a process that can find the optimal read threshold set 128 of FIG. 1 together. It is understood that the process can be applied to any m-bit per cell NAND flash, including current single level cell (SLC), multi-level cell (MLC), triple level cell (TLC), quadruple level cell (QLC), and any future NAND configuration having even more bits per cell. A key aspect of the read threshold mechanism 301 is that it does not require any prior knowledge of the data written. The optimal read threshold set 128 is the best set of the read threshold 122 of FIG. 1 including an offset count for each of the read threshold 122 {A, B, C, D, E, F, G}. The optimal read threshold set 128 can provide the highest likelihood of reading the user data 108 of FIG. 1 without detecting the uncorrectable error 132 of FIG. 1 and is based on the current condition of data within the physical block 114 of FIG. 1. It is understood that the status of the user data 108 in the physical block 114 can change over time due to condition of the cells, program/erase (P/E) count, duration of storage, read disturbs, or a combination thereof.

The read threshold 122 settings, supported by today's NAND flash, are about 256 different step values centered on the design threshold default settings. Since for TLC NAND requires 7 different read threshold 122 default settings and QLC NAND requires 15 different read threshold 122 default settings, the number of threshold steps between two adjacent levels represents a small voltage change. By way of an example, the TLC NAND can have offset steps of about 1.2 mV per step and the QLC NAND can be about 0.6 mV per step. The optimal read threshold set 128 of FIG. 1 is generally within a limited range of offset candidate values from the read threshold 122 default setting.

By way of an example, the optimal read threshold set 128 can include a threshold A that falls within the range $[A_0, A_n]$ between level ER and level A, shown in FIG. 2, and a threshold B that falls within the range $[B_0, B_n]$ between level A and level B. It is understood that the limit "n" represents the number of threshold offset steps available in the NAND being analyzed. This is also true for thresholds C through G, as well. It is understood that each of the read thresholds 122 in the optimal read threshold set 128 can offset from a default value of the read threshold 122 shown in FIG. 2 by a different amount.

The read threshold mechanism 301 can apply to any number of m-bits per cell, the process of fast threshold tuning can operate by reading the NAND flash n+1 times to determine the optimal read threshold set 128, as compared to the exhaustive search of prior art solutions that require more than $n^m$ reads for the NAND under analysis. The read threshold mechanism 301 can determine a range of offset steps that will be applied to the default thresholds {A, B, C, D, E, F, G}. This can be performed in a "determine range of offset steps" 302. The control processor 110 can limit the range of the offset steps so that the range "R" is 1≤R≤n. The limiting of the range can support latency requirements of the storage system 100, be recommended by the manufacturer of the devices in the non-volatile storage array 102, be based on previous operational knowledge, or a combination thereof. By limiting the range of the offset steps, the amount of time required to generate the optimal read threshold set 128.

By way of an example, a 3-bit per cell TLC NAND flash in the following process can be directly applied to any m-bit per cell NAND flash. As shown in FIG. 2, the 3 bits data of a TLC cell belong to MSB sector, CSB sector, and LSB sector, respectively. The 3 pages sharing the same set of cells can be called "shared pages," and the set of cells is called a "wordline." The optimal read threshold set 128 minimizes the number of errors in the read data. The control processor 110 of FIG. 1 uses the optimal read threshold set 128 across all of the wordlines within the physical block 114 of FIG. 1.

The read threshold mechanism 301 can read the user data 108 with the read threshold 122 that represents the range minimum $\{A_0, B_0, C_0, D_0, E_0, F_0, G_0\}$ for the entire wordline. The execution of a "read user data with range minimum as baseline" 304 can provide a baseline for detect level change count process but doesn't provide any error data on its own. By executing a "collect level change data with range value as Ni" 306 can only provide the level change data after the baseline is established. A decision is made to verify the range maximum has been reached. The range R provided by the control processor 110 is incremented from $R_0$ through $R_n$ as applied to each of the read threshold 122 values A through G. A "reached range maximum" 308 can determine whether all of the range $R_0$ through $R_n$ have been checked. If the range maximum has not been reached, the read threshold mechanism 301 can execute a "read user data with range=current range+1" 310. The read threshold 122 can be incremented to $\{A_1, B_1, C_1, D_1, E_1, F_1, G_1\}$ in order to capture a second view of the user data 108.

The read threshold mechanism 301 can return to the "collect level change data with range value as Ni" 306, which can now compare the second view of the user data 108 with the baseline in order to detect any of the bits in the wordline that changes value as a level change and it is logged in $N_1$, which includes $\{N_{A1}, N_{B1}, N_{C1}, N_{D1}, N_{E1}, N_{F1}, N_{G1}\}$ as the level change statistics 126. The read threshold mechanism 301 can continue incrementing the range and reading the wordline until range maximum is reached. The bit flip array 130 can include $N_1$ through $N_n$ when the "reached range maximum" 308 detects the construction of the bit flip array 130, such as $\{N_{A1}, N_{A2}, N_{A3}, N_{A4}, \ldots N_{An}\}$ for threshold A, has been completed by compiling the level change statistics 126 collected for Ni, where $1 \leq i \leq n$.

The read threshold mechanism 301 can execute a "select optimal read threshold set" 312 by scanning the bit flip array 130 in order to identify the minimum errors for each of the read threshold 122. For each of the read threshold 122, its best offset is the one with minimum $N_i$. For example, for threshold A, its best offset value can be between $A_{i_A-1}$ and $A_{i_A}$, where $i_A = \arg\min_{1 \leq i \leq n} N_{Ai}$. Since, $A_{i_A} = A_{i_A-1} + 1$, the control processor 110 can either use $A_{i_A}$ or $A_{i_A-1}$ as optimal read threshold 122 offset, both values can provide lower error rates than other selections, and the ER circuitry 124 should able to correct all errors. If the control processor 110 needs to store the optimal read threshold set 128, it can read with both offsets and compare their error counts and store the one with fewer errors. Since the control processor 110 can read the user data 108 and compute the exact level change count. The same procedure can apply to all of the other read thresholds B, C, D, E, F, and G.

When executing the read threshold mechanism 301, the control processor 110 can read back the 3 pages on the same word line at the same time. Based on the output data 206 of FIG. 2, the read threshold mechanism 301 can compute the number of cells with each level. The control processor 110 can detect the level of each cell on the word line after reading with threshold offset set $\{A_0, B_0, C_0, D_0, E_0, F_0, G_0\}$ from this initial read. Then, the control processor 110 can read the same word line with the next threshold offset set $\{A_1, B_1, C_1, D_1, E_1, F_1, G_1\}$, where each offset has higher voltage in terms of its corresponding read threshold 122 than the previous set, e.g., $A_1 = A_0 + 1$, $B_1 = B_0 + 1$, and so on. Hence, the control processor 110 is able to identify the cells which have level changes between the two reads. Among all the cells with level changes, the control processor 110 can count the number of cells with level changing to its next higher level of the threshold offset, e.g., from level ER to level A, or from level A to level B and so on. The control processor 110 can denote the number of cells whose output data 206 level changes from level ER to level A when read threshold 122 offset changes from $A_0$ to $A_1$ as $N_{A1}$. Similarly, the number of cells whose output data 206 level changes from level B to level A as $N_{B1}$, and so on to complete the level change statistics 126 as $N_{A1}, N_{B1}, N_{C1}, N_{D1}, N_{E1}, N_{F1}, N_{G1}$.

The read threshold mechanism 301, can continue to read with next threshold offset $\{A_2, B_2, C_2, D_2, E_2, F_2, G_2\}$, and again counts the number of cells whose output data 206 level changes from level ER to level A when read threshold offset changes from $A_1$ to $A_2$ and denoted as $N_{A2}$. After reading with all sets of threshold offsets up to $\{A_n, B_n, C_n, D_n, E_n, F_n, G_n\}$, there is a set of level change counts $\{A_i, B_i, C_i, D_i, E_i, F_i, G_i\}$, where $1 \leq i \leq n$. Then, we have the set of $\{N_{Ai}, N_{Bi}, N_{Ci}, N_{Di}, N_{Ei}, N_{Fi}, N_{Gi}\}$, where $1 \leq i \leq n$.

For each of the read threshold 122, its best offset is the one with minimum $N_i$. For example, for threshold A, if its best offset value is between $A_{i_A-1}$ and $A_{i_A}$, where:

$$i_A = \arg\min_{1 \leq i \leq n} N_{Ai} \qquad \text{Equation (1)}$$

Since $A_{i_A} = A_{i_A-1} + 1$, the control processor 110 can either use $A_{i_A}$ or $A_{i_A-1}$ as optimal read threshold offset since they both can provide lower error rates, and the ER circuitry 124 can correct all errors. If the control processor 110 needs to store the best offset, it can read with both offsets and compare their level change counts and store the one with fewer level changes. The same procedure applies to all of the other read thresholds B, C, D, E, F, and G. After identifying best threshold offset for each of the default read threshold 122, $\{A, B, C, D, E, F, G\}$, the control processor 110 can select the optimal read threshold set 128 for use on the sectors within the physical block 114.

Figure 4:
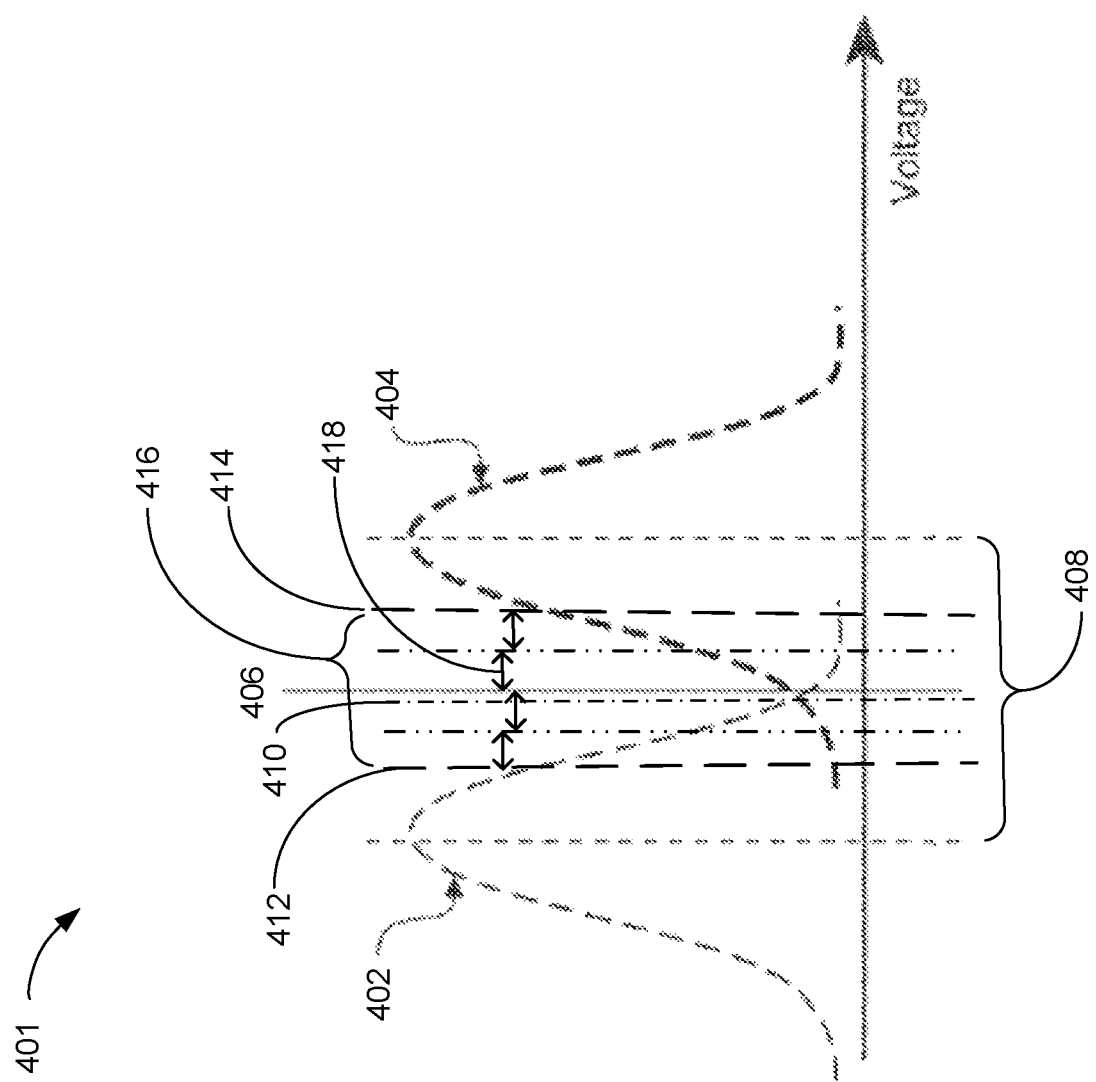
FIG. 4 is a graphical view of an exemplary access of a cell of a NAND with limited range offset.

Referring now to FIG. 4, therein is shown a graphical view of an exemplary access 401 of a cell of a NAND with limited range offset. The architectural view of an exemplary access 401 depicts a 1 voltage distribution 402, which can be defined as the distribution of possible voltages that can be interpreted as representing a value of 1. A 0 voltage distribution 404 can be defined as the distribution of possible voltages that can be interpreted as representing a value of 0. A default threshold 406 can be the design target value for reading the cell. In actual operation the default threshold is insufficient to correctly read the cell due to wear, read disturbs, and duration of storage prior to reading.

A threshold offset maximum 408 can represent the maximum offset step capability designed into the devices of the non-volatile storage array 102 of FIG. 1. As described above, an offset step 410 can be the minimum adjustment possible within the threshold offset maximum 408 as measured from the default threshold 406. By way of an example, in current NAND flash designs for SLC, MLC, TLC, and QLC, the threshold offset maximum 408 can include 256 of the offset step 410. AS shown the threshold offset maximum 408 can be designed to be centered around the default threshold 406.

It is understood that each of the default threshold 406 as shown in FIG. 2 can be any of the read threshold 122 including $\{A, B, C, D, E, F, G\}$. The control processor 110 can select a different number of the offset step 410 for each of the read threshold 122. This ability can allow the read threshold mechanism 301 of FIG. 3 to adjust the number of the offset step 410 for varying conditions of the cells through the life of the non-volatile storage array 102.

When the read threshold mechanism 301 determines the optimal read threshold set 128 of FIG. 1, the number and direction of the offset step 410 can be different for each of the read threshold 122 $\{A, B, C, D, E, F, G\}$. By reading the cell of the NAND across the threshold offset maximum 408 in single increments of the offset step 410, the read threshold mechanism 301 can collect the level change statistics 126 for selecting the optimal read threshold set 128. It is understood that the time required to perform the reads across the threshold offset maximum 408 can add significant latency to the read process.

In order to minimize the latency of the read process, the control processor 110 can identify a range minimum offset 412 and a range maximum offset 414 to restrict the extent of the read latency. The selection of the range minimum offset 412 and the range maximum offset 414 can define an offset range 416 that can limit the number of reads required to collect the level change statistics 126, while maintaining the collection of the level change statistics 126 and the integrity of the optimal read threshold set 128.

It has been discovered that the read threshold mechanism 301 can identify the number and direction of the offset step 410 having the minimum number of level changes in the set $\{N_{Ai}, N_{Bi}, N_{Ci}, N_{Di}, N_{Ei}, N_{Fi}, N_{Gi}\}$, where $1 \leq i \leq n$. It is understood that the number i can be different for each of the read threshold 122 {A, B, C, D, E, F, G}. The read threshold mechanism 301 can provide the optimal read threshold set 128 of FIG. 1 without performing exhaustive testing of all possible thresholds.

In order to further reduce the latency required to determine the optimal read threshold set 128, the threshold offset range 416 can be divided into a number of K subdivision 418. For ease of description and brevity, the K subdivisions 418 are shown to be four, but any number is possible up to the threshold offset maximum 408. The read threshold mechanism 301 can initially evaluate the level change statistics 126 at the boundaries of the K subdivision 418. When a sample at the boundaries of the K subdivision 418 detects a change in the bit state, a smaller value of K can be selected in order to read the contents of the cell of the NAND being evaluated. By setting the count of the offset step 410 to read from the K subdivision 418 that detected the change in the bit state toward the previous boundary of the K subdivision 418. By reducing the step size and direction in the K subdivision 418, the minimum number of level changes in the set $\{N_{Ai}, N_{Bi}, N_{Ci}, N_{Di}, N_{Ei}, N_{Fi}, N_{Gi}\}$, where $1 \leq i \leq n$ can be identified quickly.

For the read threshold 122 "X", where $X \in \{A, B, C, D, E, F, G\}$, the range minimum offset 412 $X_{min}$, and the range maximum offset 414 $X_{max}$ can define the threshold offset range 416. The threshold offset range 416 $[X_{min}, X_{max}]$ can be divided into K subdivisions 418, such that $X_0 = X_{min}$, $X_K = X_{max}$, and $X_{k+1} - X_k = X_k - X_{k-1}$, for $1 \leq k \leq K-1$. Then, the read threshold mechanism 301 can find that the best read offset for threshold X is between $X_{i_x-1}$ and $X_{i_x}$, but this time $X_{i_x} - X_{i_x-1} > 1$. Therefore, the searching range is reduced from $[X_{min}, X_{max}]$ to $[X_{i_x}, X_{i_x-1}]$, and we can repeat this until $X_{i_x} - X_{i_x-1} = 1$. Obviously, with careful selection of the K subdivision 418, the number of reads required to locate the minimum number of level changes in the set $\{A_{Ai}, N_{Bi}, N_{Ci}, N_{Di}, N_{Ei}, N_{Fi}, N_{Gi}\}$, is in the order of log(n), where n is the number of all possible read offsets between two adjacent levels.

Figure 5:
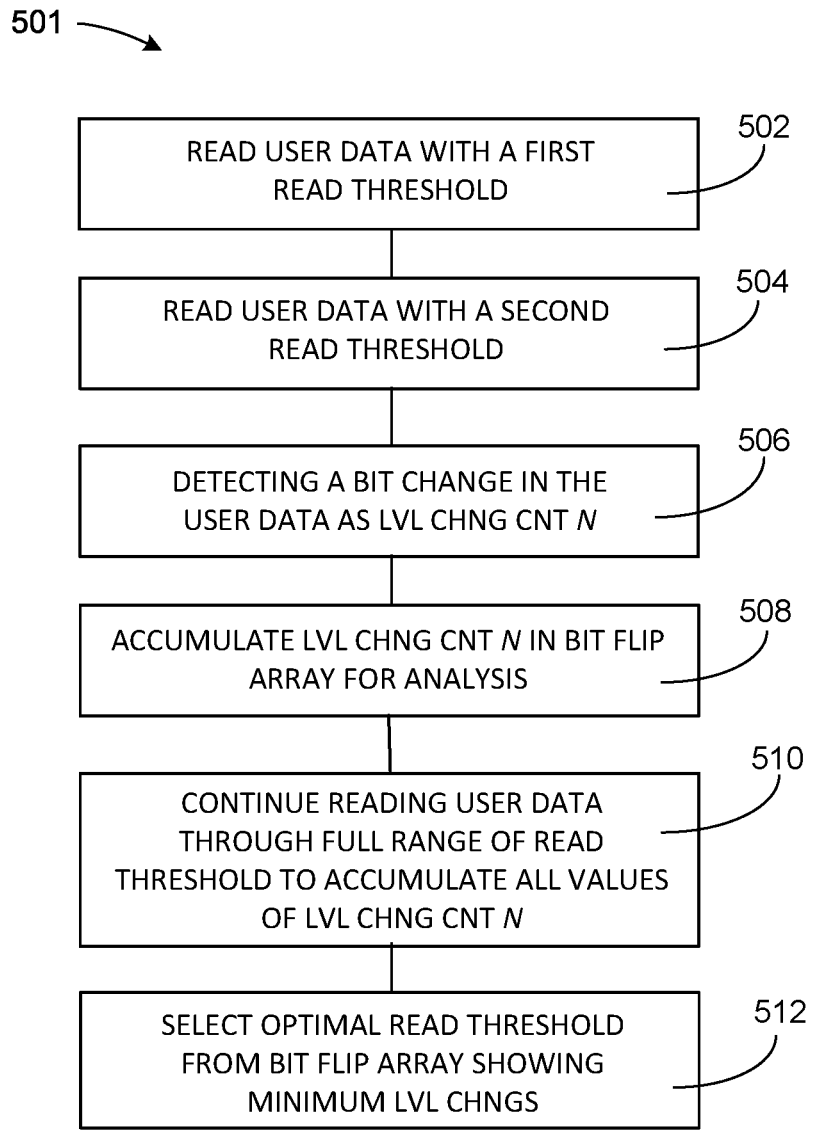
FIG. 5 is an operational flow diagram of the storage system with read threshold mechanism in an embodiment of the present invention.

Referring now to FIG. 5, therein is shown an operational flow diagram 501 of the storage system 100 with read threshold mechanism in an embodiment of the present invention. It is understood that the functions described in this application can be implemented as instructions stored on a non-transitory computer readable medium to be executed by a host processor (not shown), the control processor unit 110 of FIG. 1, a math co-processor, a processor core, or a combination thereof.

The non-transitory computer readable medium can include compact disk (CD), digital video disk (DVD), or universal serial bus (USB) flash memory devices. The non-transitory computer readable medium can be integrated as a part of a host system not shown or installed as non-volatile memory array 102 of the storage system 100.

The non-transitory computer readable medium can include instructions required to perform the operations of "reading user data with first read threshold" 502. The first selection of the read threshold 122 of FIG. 1 can be the default threshold 406 of FIG. 4, the range minimum 412 of FIG. 4, the K subdivision 418 of FIG. 4, or any initial value of the read threshold 122 within the threshold offset maximum 408 of FIG. 4. The user data 108 of FIG. 1 read with the initial value of the read threshold 122 can be a baseline for further analysis.

The flow can include "read user data with a second read threshold" 504, in which the control processor 110 of FIG. 1 can increment the initial value of the read threshold 122 by the offset step 410, the K subdivision 418, or a combination thereof. The user data 108 read with the second value of the read threshold 122 can be different from the baseline.

The flow includes "detecting a bit change in the user data as level change count $N_i$" 506, the control processor 110 can monitor the occurrence of any bit value changes in the user data 108 as the error $N_i$. The error $N_i$ can be accumulated in the bit flip array 130 of FIG. 1. The flow includes the process of "accumulate level change count $N_i$ in bit flip array for analysis" 508. The bit flip array 130 can accommodate the offset values for each of the default threshold 406, such as the read threshold 122 {A, B, C, D, E, F, G}. The bit flip array 130 can have a count of the bits that changed from the read of the user data 108 with the previous threshold offset value.

The flow includes "continue reading user data through full range of read threshold to accumulate all values of level change count N" 510, where the control processor 110 can step the read threshold 122 by the offset step 410, the K subdivision 418, or a combination thereof. The read of the user data 108 for each of the read threshold 122 selected by the control processor 110 will generate an additional entry to the bit flip array 130. It is understood that the control processor 110 can use combinations of the K subdivision 418 and the offset step 410 to minimize the latency of the read processing.

The flow can include "select optimal read threshold from bit flip array showing minimum level changes" 512. The control processor 110 can sort the bit flip array 130 to identify the minimum level change count for each of the read threshold 122 {A, B, C, D, E, F, G}. The read threshold offset value of each of the read threshold 122 {A, B, C, D, E, F, G} can be selected as the optimal read threshold set 128 of FIG. 1. It is understood that each of the read threshold 122 {A, B, C, D, E, F, G} can have a different value of the read threshold offset for best read performance. Once the optimal read threshold set 128 is identified, it will provide the best reading for the sector 0 116 of FIG. 1 through the sector N 118 of FIG. 1 in the physical block 114 of FIG. 1. It is understood that upon the occurrence of the detection of the uncorrectable error 132, the operational flow diagram 501 of the storage system 100 can be repeated in order to adjust the optimal read threshold set 128 to the new conditions of the sector 0 116 through the sector N 118. The control processor 110 can incorporate historic trends in changes of the optimal read threshold set 128 in order to select the K subdivision 418 likely to provide the minimum latency in the read of the user data 108.

It has been discovered that the storage system 100 can increase performance of the non-volatile storage array 102 when accessing the user data 108. The selection and adjustment of the optimal read threshold set 128 can minimize the likelihood of detecting the uncorrectable error 132 of FIG. 1 when accessing the sector 0 116 through the sector N 118 of the physical block 114. It is understood that each of the physical block 114 in the non-volatile storage array 102 can have a different set of values for the optimal read threshold set 128.

Figure 6:
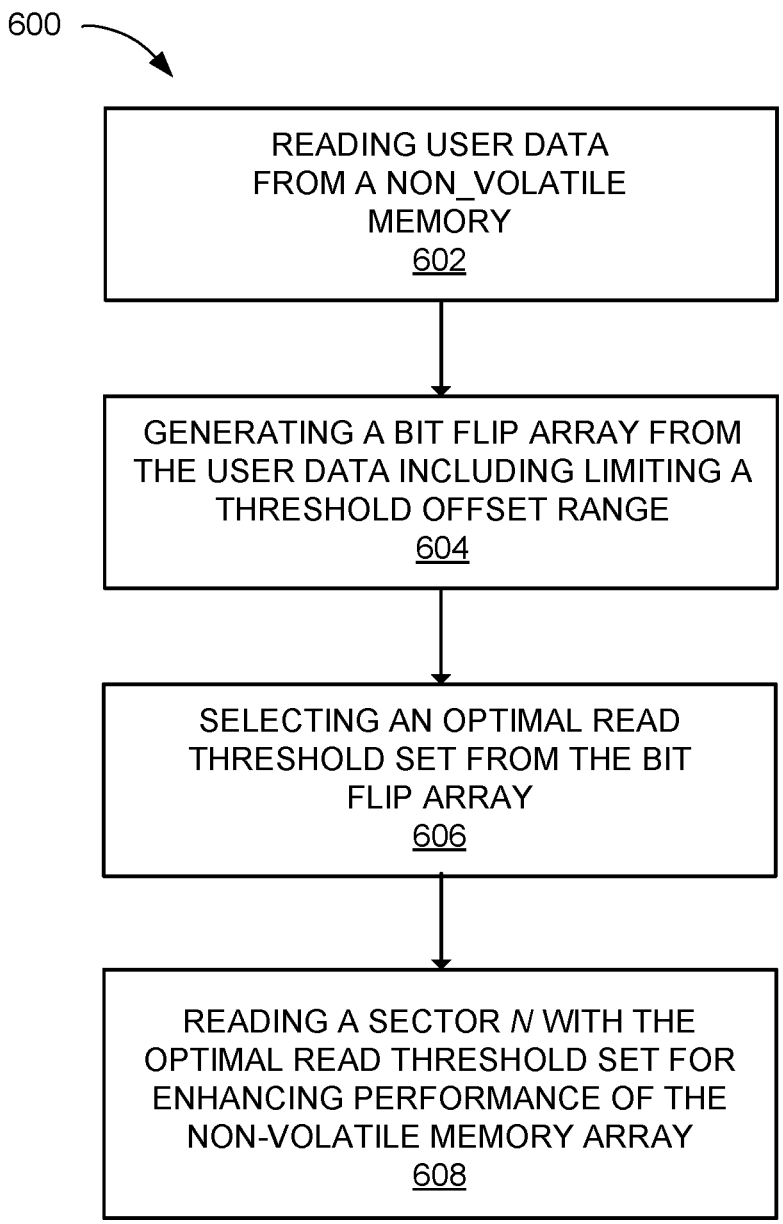
FIG. 6 is a flow chart of a method of operation of a storage system in an embodiment of the present invention.

Referring now to FIG. 6, therein is shown a flow chart of a method 600 of operation of a storage system 100 in an embodiment of the present invention. The method 600 includes: reading user data from a non-volatile memory array in a block 602; generating a bit flip array from the user data including limiting a threshold offset range, in a block 604; selecting an optimal read threshold set from the bit flip array in a block 606; and reading a sector N with the optimal read threshold set for enhancing performance of the non-volatile memory array in a block 608.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level. While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A storage system comprising:
a control processor, configured to:
read user data,
generate a bit flip array from the user data includes limiting a threshold offset range without an error recovery (ER) circuitry correcting the data, and
select an optimal read threshold set from the bit flip array including an offset count calculated for each read threshold in the optimal read threshold set; and
a non-volatile memory array, coupled to the control processor, configured to store the user data; and
wherein the control processor is further configured read a sector N with the optimal read threshold set for enhancing performance of the non-volatile memory array.

2. The system as claimed in claim 1 wherein the control processor is further configured to define the threshold offset range to be less than a threshold offset maximum when reading the user data.

3. The system as claimed in claim 1 wherein the control processor is further configured to adjust a read threshold to generate the bit flip array when reading the user data.

4. The system as claimed in claim 1 wherein the control processor is further configured to define a K subdivision of the threshold offset range for reducing a size of the bit flip array.

5. The system as claimed in claim 1 wherein the control processor is further configured to adjust the optimal read threshold set when an uncorrectable error is detected.

6. The system as claimed in claim 1 wherein the control processor is further configured to calculate a minimum element of the bit flip array to select the optimal read threshold set.

7. The system as claimed in claim 1 wherein the control processor is configured to read the user data in a sector 0 through sector N of a physical block using the optimal read threshold set.

8. The system as claimed in claim 1 wherein the control processor is further configured to define a range minimum adjacent to a default read threshold and a range maximum opposite the range minimum.

9. The system as claimed in claim 1 wherein the control processor is further configured to adjust a read threshold to a K subdivision includes reducing the K subdivision by an offset step to locate a minimum element of the bit flip array.

10. The system as claimed in claim 1 wherein the control processor is further configured to define the threshold offset range centered on each of the read threshold includes reading the user data at each offset step through the threshold offset range.

11. A method of operation of a storage system comprising:
reading user data from a non-volatile memory array;
generating a bit flip array from the user data by limiting a threshold offset range without an error recovery (ER) circuitry correcting the data;
selecting an optimal read threshold set from the bit flip array including calculating an offset count for each read threshold in the optimal read threshold set; and
reading a sector N with the optimal read threshold set for enhancing performance of the non-volatile memory array.

12. The method as claimed in claim 11 further comprising defining the threshold offset range to be less than a threshold offset maximum when reading the user data.

13. The method as claimed in claim 11 further comprising adjusting a read threshold to generate the bit flip array when reading the user data.

14. The method as claimed in claim 11 further comprising defining a K subdivision of the threshold offset range for reducing a size of the bit flip array.

15. The method as claimed in claim 11 further comprising adjusting the optimal read threshold set when an uncorrectable error is detected.

16. The method as claimed in claim 11 further comprising calculating a minimum element of the bit flip array to select the optimal read threshold set.

17. The method as claimed in claim 11 further comprising reading the user data in a sector 0 through sector N of a physical block using the optimal read threshold set.

18. The method as claimed in claim 11 further comprising defining a range minimum adjacent to a default read threshold and a range maximum opposite the range minimum.

19. The method as claimed in claim 11 further comprising adjusting a read threshold to a K subdivision includes reducing the K subdivision by an offset step to locate a minimum element of the bit flip array.

20. The method as claimed in claim 11 further comprising defining the threshold offset range centered on each of the read threshold includes reading the user data at each offset step through the threshold offset range.

21. A non-transitory computer readable medium including instructions for execution, the medium comprising:
reading user data from a non-volatile memory array;
generating a bit flip array from the user data including limiting a threshold offset range without an error recovery (ER) circuitry correcting the data;
selecting an optimal read threshold set from the bit flip array including calculating an offset count for each read threshold in the optimal read threshold set; and reading a sector N with the optimal read threshold set for enhancing performance of the non-volatile memory array.

22. The medium as claimed in claim 21 further comprising defining the threshold offset range to be less than a threshold offset maximum when reading the user data.

23. The medium as claimed in claim 21 further comprising adjusting a read threshold to generate the bit flip array when reading the user data.

24. The medium as claimed in claim 21 further comprising defining a K subdivision of the threshold offset range for reducing a size of the bit flip array.

25. The medium as claimed in claim 21 further comprising adjusting the optimal read threshold set when an uncorrectable error is detected.

26. The medium as claimed in claim 21 further comprising calculating a minimum element of the bit flip array to select the optimal read threshold set.

27. The medium as claimed in claim 21 further comprising reading the user data in a sector 0 through sector N of a physical block using the optimal read threshold set.

28. The medium as claimed in claim 21 further comprising defining a range minimum adjacent to a default read threshold and a range maximum opposite the range minimum.

29. The medium as claimed in claim 21 further comprising adjusting a read threshold to a K subdivision includes reducing the K subdivision by an offset step to locate a minimum element of the bit flip array.

30. The medium as claimed in claim 21 further comprising defining the threshold offset range centered on each of the read threshold includes reading the user data at each offset step through the threshold offset range.

* * * * *